United States Patent [19]

Cherian

[11] Patent Number: 4,639,818

[45] Date of Patent: Jan. 27, 1987

[54] VENT HOLE ASSEMBLY

[75] Inventor: Gabe Cherian, Fremont, Calif.

[73] Assignee: Raychem Corporation, Menlo Park, Calif.

[21] Appl. No.: 776,943

[22] Filed: Sep. 17, 1985

[51] Int. Cl.⁴ .............................................. H02H 5/04
[52] U.S. Cl. ...................................... 361/106; 361/58; 338/22 R; 219/505; 219/523; 219/548
[58] Field of Search ......................... 361/58, 103, 106; 219/505, 523, 548; 338/22 R, 22 SD, 4

[56] References Cited

U.S. PATENT DOCUMENTS

| | | | |
|---|---|---|---|
| 3,719,796 | 3/1973 | Abildtrup | 338/22 R X |
| 4,118,753 | 10/1978 | Vind | 361/331 |
| 4,210,800 | 7/1980 | Van Bokestal et al. | 338/22 R X |
| 4,329,726 | 5/1982 | Middleman et al. | 361/58 |
| 4,450,496 | 5/1984 | Doljack et al. | 361/58 |
| 4,475,138 | 10/1984 | Middleman et al. | 361/58 |
| 4,542,365 | 9/1985 | McTavish et al. | 361/106 X |

Primary Examiner—A. D. Pellinen
Assistant Examiner—Derek S. Jennings
Attorney, Agent, or Firm—Stephen C. Kaufman; Herbert G. Burkard; T. H. P. Richardson

[57] ABSTRACT

Circuit protection devices comprise a PTC conductive polymer element within a hollow enclosure which is sealed except for at least one vent. The vent is sealed by means of a cover member, preferably of adhesive tape. The exterior surface of the enclosure adjacent the vent and under the cover member is provided with indentations which change the internal pressure required to blow the cover member off the vent, and/or enable the cover member to open during a hot washing step and subsequently to reseal without admitting wash liquid, and/or control the direction in which gases flow after passing through the vent.

19 Claims, 3 Drawing Figures

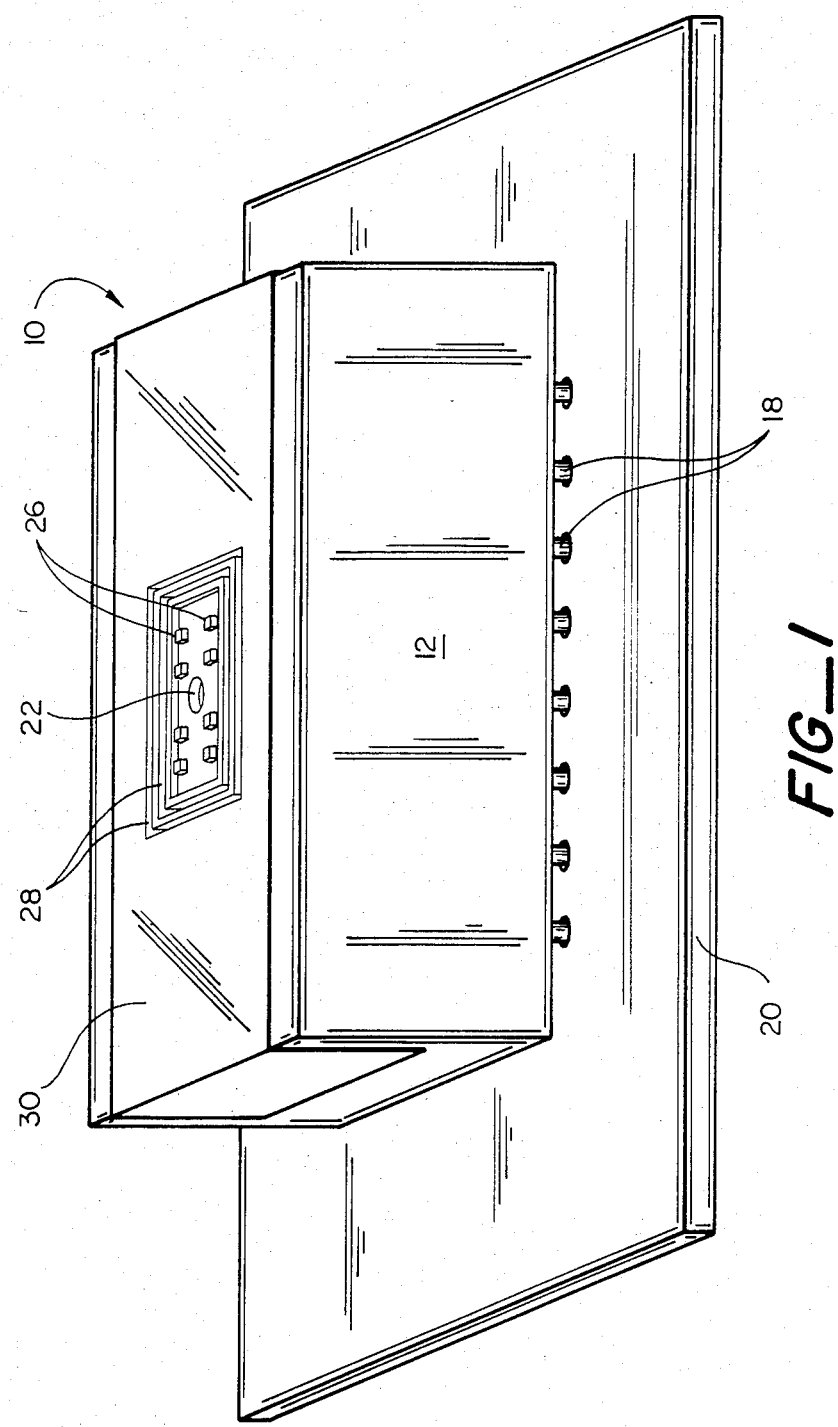

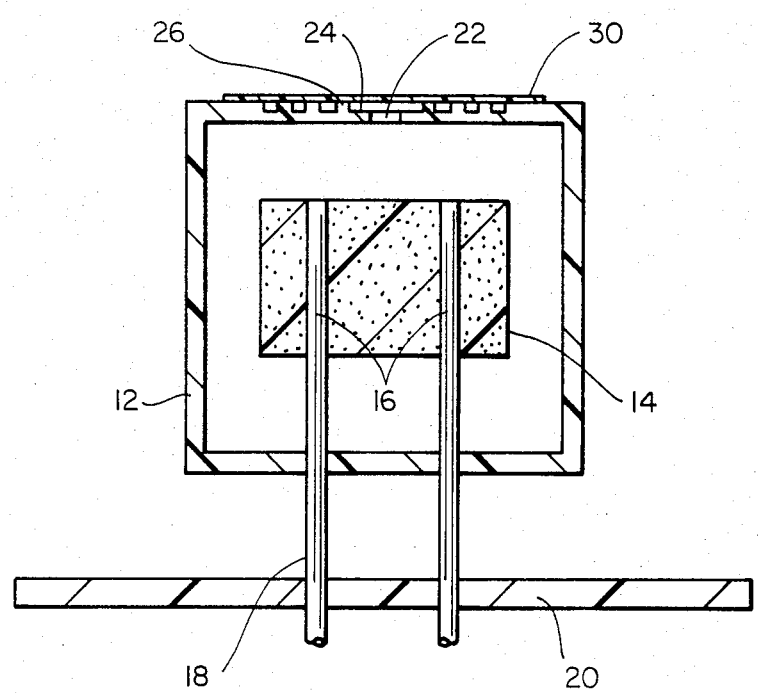
FIG_2
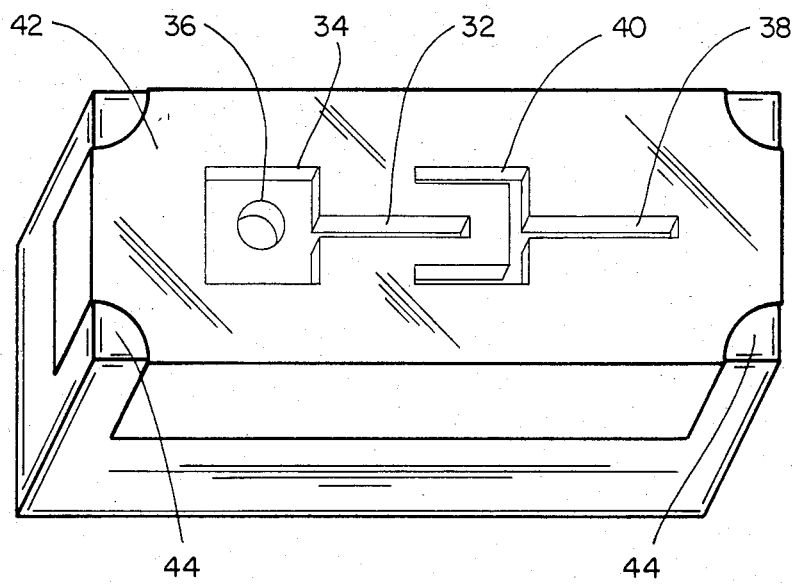
FIG_3

VENT HOLE ASSEMBLY

BACKGROUND OF THE INVENTION

1. Field of the Invention

This invention relates to electrical devices comprising enclosures which are sealed except for one or more small vents, and from which gas must be vented during use. The invention is particularly concerned with circuit protection devices in which one or more PTC conductive polymer elements are positioned within an enclosure.

2. Introduction to the Invention

In recent years much progress has been made in the design, manufacture and use of circuit protection devices containing PTC conductive polymer devices. Reference may be made for example to U.S. Pat. Nos. 4,237,441, 4,238,812, 4,255,698, 4,315,237, 4,317,027, 4,352,083, 4,413,301, 4,481,498 and 4,450,496 and to copending commonly assigned U.S. patent application Ser. Nos. 524,482, 628,945, 711,790, 711,907, 711,908, 711,909 and 711,910. The disclosure of each of these patents and patent applications is incorporated herein by reference.

In many circumstances, one or more PTC conductive polymer circuit protection devices are placed within a hollow enclosure. Since a conductive polymer element can, under certain circumstances, generate a substantial quantity of gas, it is necessary for the enclosure to comprise a vent or a thin section which will shatter and become a vent before the internal gas pressure becomes excessive.

SUMMARY OF THE INVENTION

When a PTC conductive polymer device is to be connected to another electrical component by a process which involves a washing step, e.g. when it is to be mounted on a printed circuit board by a wave soldering method which includes a hot wash, the device must be surrounded by an enclosure which will prevent contact between the device and the wash liquid. It is not easy to find an economically acceptable way of reconciling this requirement with the need for venting in subsequent use of the device. For example, it is possible to design the enclosure with a very thin section which will withstand washing, but will be blown out (and thus provide a vent) when the internal pressure reaches some specified value. In practice, however, it is very difficult to manufacture such an enclosure to the very close tolerances which are essential for predictable behavior. It is also possible to manufacture the enclosure with a vent, to cover the vent with a suitable cover member (e.g. a piece of adhesive tape) during the washing step, and to remove the cover member after the washing step; however, removal of the cover member is an undesirable manufacturing step. It is also notionally possible to manufacture the enclosure with a vent and to cover the vent with a cover member which will remain in place during a hot washing step, the vent and the cover member being such that in subsequent use of the device, the cover member will remain in place until the internal pressure exceeds a safe level, at which time it will be blown off the enclosure. However, it has not proved possible to convert this notional possibility into a practical reality.

In its first aspect, the present invention provides another way of reconciling the conflicting demands of (a) protection during washing and (b) venting ability during subsequent use. In this aspect, although the invention is of particular value for assemblies which comprise one or more PTC conductive polymer circuit protection devices surrounded by a hollow enclosure, it is also applicable to assemblies which comprise other types of electrical device surrounded by a hollow enclosure. In this aspect, the enclosure is provided with a vent and, on the exterior of the enclosure adjacent the vent, a plurality of channels; and a deformable cover member, preferably a pressure-sensitive-adhesive-backed electrically insulating tape, is releasably secured over the vent and the channels. During a hot washing step, expansion of gases within the enclosure can force part, but not all, of the cover member to separate from the enclosure, thus allowing the gases to escape. So long as the internal pressure exceeds the external pressure, no washing liquid can enter the enclosure. When the external pressure exceeds the internal pressure, e.g. when the hot wash liquid is changed to a cold wash liquid, the cover member is forced back into contact with the enclosure so that no wash liquid can enter the enclosure. The channels ensure that a satisfactory seal is created when the cover member is forced back into contact with the enclosure. I have found that in this way, it is possible to design an assembly which is not damaged by washing (though it does not, strictly speaking, remain sealed during washing) and which, in subsequent use, will have completely satisfactory venting ability.

In a preferred embodiment of the first aspect of the invention, there is provided an assembly which comprises (1) at least one circuit protection device which comprises a PTC conductive polymer element;

(2) a hollow enclosure which surrounds and is spaced apart from the protection device, which is hermetically sealed except for at least one vent, and whose exterior surface adjacent the vent (i.e. the sole vent, if there is only one vent, or each vent, if there is more than one vent) is provided with a plurality of channels; and (3) a deformable cover member which is releasably secured to the exterior surface of the enclosure which defines the vent and the channels.

Such an assembly can be soldered to another electrical component e.g. a printed circuit board, by a process which includes washing with a hot liquid, and during that process, the cover member will be partially released to allow gases to escape from the enclosure and will subsequently return to a position in which it will prevent wash liquid from entering the enclosure. A preferred process of this kind comprises mounting a plurality of circuit protection devices on a printed circuit board by (1) providing an assembly which comprises
  (a) a plurality of circuit protection devices, each of the devices comprising a PTC conductive polymer element, two electrodes in electrical contact therewith, and two electrical leads in respective contact with the electrodes;
  (b) a hollow enclosure which surrounds and is spaced apart from the protection devices; through one wall of which pass the electrical leads; which is hermetically sealed except for at least one vent, the vent comprising a straight through hole and a recessed portion in the exterior surface of the enclosure, the area of the recessed portion being at least 3 times the cross-sectional area of the vent; and which comprises, on its exterior surface adjacent the vent, at least one channel which does not communicate with the vent; and (c) a pressure-sensitive-adhesive-backed tape which is releasably secured to the exterior surface of the enclosure which defines the vent and the channel;

(2) positioning the assembly on a printed circuit board;

(3) soldering the electrical leads of the assembly to the circuit board; and (4) washing the circuit board and the assembly soldered thereto, the assembly and the conditions during the washing step being such that, during the washing step, expansion of the gases within the enclosure generates a rise in the internal pressure, which in turn causes the tape to become partially detached from the enclosure to allow gases to be vented from the enclosure, and thereafter, when the rise of the internal pressure stops or when the internal pressure decreases, the tape recontacts the enclosure and reseals the vent, thereby preventing entry of wash liquid into the enclosure.

Another problem which I have encountered with vented enclosures is that when vents of normal dimensions i.e. vents which are straight through holes of relatively small diameter) are sealed with available adhesive tapes (whether to withstand washing or for other reasons), the internal pressure required to blow the tape off the vent is unacceptably high. In its second aspect (which, like the first aspect, is applicable to any assembly in which an electrical device is positioned within an enclosure), this invention provides a solution to this problem through the use of a cover member which is releasably secured to the exterior of the enclosure and over the vent, the cover member and the vent being such that the surface area of the cover member which is exposed to internal pressure (when the pressure within the enclosure exceeds the external pressure on the cover member) is greater that the smallest cross-sectional area of the vent.

In a preferred embodiment of this second aspect of the invention, there is provided an assembly which comprises (1) at least one circuit protection device which comprises a PTC conductive polymer element;

(2) a hollow enclosure which surrounds and is spaced apart from the protection device and which is hermetically sealed except for at least one vent; and (3) a cover member which is releasably secured to the exterior surface of the enclosure which defines the vent;

the vent and the cover member being such that the surface area of the cover member which is exposed to internal pressure, when the pressure within the enclosure exceeds the external pressure on the cover member, is at least 3 times the smallest cross-sectional area of the vent.

Yet another problem which arises with vented enclosures containing PTC conductive polymer circuit protection devices and which has not previously been recognized, is that, when tripping of the devices causes gases to be vented, these gases carry with them powdered carbonaceous materials which can be deposited on adjacent electrical components, thus giving rise to shorts. This is a particular problem with devices which are mounted on printed circuit boards. In its third aspect, this invention provides a solution to this problem through the use of a cover member which is positioned over the vent and directs the flow of gases (with the particles entrained therein) so that they do the minimum amount of harm, e.g. so that a greater proportion of the entrained particles are deposited on the enclosure itself. Note that the disposition of carbonaceous materials on the cover member provides indication that at least one device may be on the verge of failure.

In a preferred embodiment of this third aspect of the invention, there is provided an assembly which comprises (1) at least one circuit protection device which comprises a PTC conductive polymer element;

(2) a hollow enclosure which surrounds and is spaced apart from the protection device and which is hermetically sealed except for at least one vent; and (3) a cover member which, when the internal pressure causes gases to flow from the enclosure, substantially changes the direction of the gas flowing from the enclosure.

BRIEF DESCRIPTION OF THE DRAWING

The invention is illustrated in the accompanying drawing in which

FIG. 1 is a perspective view of a device of the invention mounted on a printed circuit board;

FIG. 2 is a vertical cross-section through FIG. 1 along the line of the vent hole at right angles to the longitudinal axis of the enclosure; and FIG. 3 is a perspective view of one aspect of the invention.

DETAILED DESCRIPTION OF THE INVENTION

In each of the aspects of the invention, the cover member is preferably secured to the enclosure by means of an adhesive, particularly a pressure-sensitive adhesive. the cover member is preferably composed of an electrically insulating material, so that it cannot provide an electrical short, either when it is fully secured to the enclosure or when it is detached from the enclosure as a result of venting. When the cover member becomes detached from the enclosure so as to permit venting, it preferably remains intact and is only partially detached; if the cover member becomes completely detached or is fragmented, it can cause some undesirable effect and cannot serve, as is preferred, to control the direction in which gases (and any carbonaceous or other particles entrained therein) flow after leaving the vent. I have obtained excellent results using commercially available pressure-sensitive-adhesive-backed polymeric tapes, in particular that sold by Minnesota Mining & Manufacturing, St. Paul, Minn. under the trade name Scotch Tape 5413 which comprises a base tape of an aromatic polyimide (sold by E. I. du Pont de Nemours under the trade name "Kapton") and an adhesive coating of a pressure-sensitive silicone adhesive. A wide range of such tapes is available, and those skilled in the art will have no difficulty, having regard to their own knowledge and the disclosure herein, in selecting suitable tapes for particular situations. The tape undergoes deformation, preferably elastic deformation, as it is detached from the enclosure by the internal pressure. In many cases, it is desirable, in order to ensure that the tape is only partly detached from the enclosure during venting, to secure the tape, on at least one side of the vent, to a wall of the enclosure which is at a substantial angle to the wall of the enclosure which defines the vent. For example, if the enclosure is in the form of a rectangular parallelepiped, the vent is preferably formed on one face and the tape extends across that face and down at least two of the faces at right angles thereto. If desired, the cover member can be formed so as to direct the flow of gases away from the enclosure in a particular direction. For example a tape can have one or more holes in it so that, as the tape is detached from the enclosure, venting gases are directed through the hole(s).

While it is theoretically possible to select, for any given size of straight-through vent, an adhesive tape whose adhesion to the enclosure is such that the tape will become detached at any desired internal pressure, I am not aware of any available adhesive tapes which can be used satisfactorily to seal conventional sized vents. Likewise, it is theoretically possible to maintain the vent as a straight-through hole, but to increase its diameter so that, using available adhesive tapes, the tape will become detached at the desired internal pressure; but this would require a vent of a size which would make it unacceptable, or at least undesirable, for other reasons. Accordingly, in this invention, the vent preferably comprise two parts, namely at least one first part, closer to the interior of the enclosure, each of which first part is of relatively small cross-sectional area, e.g. diameters ranging from 0.01 to 0.4 inch, preferably 0.03 to 0.01 inch and which is typically a straight through hole, and a second part which is a recess in the exterior surface of the enclosure and which is of relatively large area, preferably at least 3 times, e.g. 5 to 400 times, particularly 30 to 100 times, the cross-sectional area of the first part. The second part can contain upstanding portions which prevent the tape from adhering to the bottom of the recess and/or act as baffles which direct the flow of gases as they are vented, for example to increase the path length or to control turbulence or flames.

The exterior surface of the enclosure can comprise additional indentations which will provide desired functions, e.g. channels which prevent wash liquid from entering the enclosure (as noted above) or which help to control the flow of gases venting from the enclosure as they tunnel under a partially detached cover member.

Attention is now directed to the drawings. FIG. 1 provides a perspective view of an assembly 10 which comprises a hollow enclosure 12 which is rigid and is a rectangular parallelepiped. As shown in FIG. 1 and the cross-sectional view of FIG. 2, the enclosure 12 surrounds and is spaced apart from eight discrete PTC conductive polymer elements 14, each of which elements 14 comprise electrodes 16 and electrical leads 18, the ends of the leads 18 being attached to a printed circuit board 20. The enclosure 12 is hermetically sealed except for a vent 22. The vent 22 comprises a straight through hole and a recessed portion 24 in the exterior surface of the enclosure 12. The recessed portion 24 contains upstanding portions 26. The exterior surface of the enclosure 12 adjacent the vent 22 is provided with channels 28 which comprise two endless loops which surround the vent 22 and the recessed portion 24 and which do not intersect. A deformable cover member 30, which comprises a pressure-sensitive-adhesive-backed tape (the adhesive not shown), is releasably secured to the exterior surface of the enclosure 12 which defines the vent 22 and the channels 28. The tape is secured to the flat face of the enclosure and to exterior surfaces of the enclosure which are at a substantial angle to the flat face.

FIG. 3 is similar to FIG. 1 but shows a different pattern of channels besides endless loops, namely, a first channel 32 that originates from a recessed portion 34 of a vent hole 36, and a second channel 38 that is separated from the first channel 32 by a cascade member 40. A cover member 42, here provided with perforations, e.g. at location 44, is releasably secured over the first and second channels 32 and 38 and cascade member 40. The enclosure and tape are so shaped that selected areas along the edge of the tape, namely the perforations, provide a preferred route for the escape of gases from inside the enclosure.

I claim:

1. An assembly which comprises
(1) at least one circuit protection device which comprises a PTC conductive polymer element;
(2) a hollow enclosure which surrounds and is spaced apart from the protection device, which is hermetically sealed except for at least one vent, and whose exterior surface adjacent the vent is provided with a plurality of channels; and
(3) a deformable cover member which is releasably secured to the exterior surface of the enclosure which defines the vent and the channels.

2. An assembly according to claim 1 wherein the channels comprise at least one endless loop around the vent.

3. An assembly according to claim 1 wherein the channels comprise at least two endless loops which surround the vent and which do not intersect.

4. An assembly according to claim 1 wherein the cover member is a pressure-sensitive-adhesive-backed tape.

5. An assembly according to claim 4 wherein the vent and the channels are formed in a flat face of the enclosure and the tape is secured to that flat face and to at least one exterior surface of the enclosure which is at a substantial angle to that flat face.

6. An assembly according to claim 5 wherein the enclosure is a rectangular parallelepiped which contains a plurality of protection devices.

7. An assembly according to claim 4 wherein the enclosure and the tape are so shaped that selected areas along the edge of the tape provide a preferred route for the escape of gases from inside the enclosure.

8. An assembly according to claim 4 wherein the cross-sectional area of the vent adjacent the cover member is at least 3 times the smallest cross-sectional area of the vent.

9. An assembly according to claim 4 wherein the vent comprises a straight through hole and a recessed portion in the exterior surface of the enclosure.

10. An assembly according to claim 9 wherein the recessed portion contains upstanding portions.

11. An assembly which comprises
(1) at least one circuit protection device which comprises a PTC conductive polymer element;
(2) a hollow enclosure which surrounds and is spaced apart from the protection device and which is hermetically sealed except for at least one vent; and
(3) a cover member which is releasably secured to the exterior surface of the enclosure which defines the vent;

the vent and the cover member being such that the surface area of the cover member which is exposed to internal pressure, when the pressure within the enclosure exceeds the external pressure on the cover member, is at least 3 times the smallest cross-sectional area of the vent.

12. An assembly according to claim 11 wherein the cover member is a pressure-sensitive-adhesive-backed tape.

13. An assembly according to claim 12 wherein the vent hole is formed in a flat face of the enclosure and the tape is secured to that flat face and to at least one exterior surface of the enclosure which is at a substantial angle to that flat face.

14. An assembly according to claim 12 wherein the enclosure and the tape are so shaped that selected areas along the edge of the tape provide a preferred route for the escape of gases from inside the enclosure.

15. An assembly according to claim 12 wherein the vent comprises a straight through hole and a recessed portion in the exterior surface of the enclosure.

16. An assembly which comprises
(1) at least one circuit protection device which comprises a PTC conductive polymer element;
(2) a hollow enclosure which surrounds and is spaced apart from the protection device and which is hermetically sealed except for at least one vent; and
(3) a cover member which, when the internal pressure causes gases to flow from the enclosure, substantially changes the direction of the gas flowing from the enclosure.

17. An assembly according to claim 16 wherein the protection device is secured to a printed circuit board.

18. A method of mounting a plurality of circuit protection devices on a printed circuit board, which method comprises
(1) providing an assembly which comprises
   (a) a plurality of circuit protection devices, each of the devices comprising a PTC conductive polymer element, two electrodes in electrical contact therewith, and two electrical leads in respective contact with the electrodes;
   (b) a hollow enclosure which surrounds and is spaced apart from the protection devices; through one wall of which pass the electrical leads; which is hermetically sealed except for at least one vent, the vent comprising a straight through hole and recessed portion in the exterior surface of the enclosure, the area of the recessed portion being at least 3 times the cross-sectional area of the vent; and which comprises, on its exterior surface adjacent the vent, at least one channel which does not communicate with the vent; and
   (c) a pressure-sensitive-adhesive-backed tape which is releasably secured to the exterior surface of the enclosure which defines the vent and the channel;
(2) positioning the assembly on a printed circuit board;
(3) soldering the electrical leads of the assembly to the circuit board;
(4) washing the circuit board and the assembly soldered thereto, the assembly and the conditions during the washing step being such that, during the washing step, expansion of the gases within the enclosure generates a rise in the internal pressure, which in turn causes the tape to become partially detached from the enclosure to allow gases to be vented from the enclosure, and thereafter, when the rise of the internal pressure stops or when the internal pressure decreases, the tape recontacts the enclosure and reseals the vent, thereby preventing entry of wash liquid into the enclosure.

19. A method according to claim 18, wherein the tape is polymeric.

* * * * *